United States Patent

Ishii et al.

(10) Patent No.: US 6,677,099 B1
(45) Date of Patent: Jan. 13, 2004

(54) POSITIVE TYPE PHOTOSENSITIVE POLYIMIDE RESIN COMPOSITION

(75) Inventors: Kazuhisa Ishii, Funabashi (JP); Tomonari Nakayama, Funabashi (JP); Takayasu Nihira, Funabashi (JP); Hiroyoshi Fukuro, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

(21) Appl. No.: 10/148,396

(22) PCT Filed: Nov. 24, 2000

(86) PCT No.: PCT/JP00/08296

§ 371 (c)(1), (2), (4) Date: May 30, 2002

(87) PCT Pub. No.: WO01/40873

PCT Pub. Date: Jun. 7, 2001

(30) Foreign Application Priority Data

Nov. 30, 1999 (JP) ............................................. 11-339518

(51) Int. Cl.[7] ............................ G03F 7/023; G03F 7/30
(52) U.S. Cl. ....................... 430/165; 430/191; 430/193
(58) Field of Search ................................ 430/165, 191, 430/192, 193

(56) References Cited

U.S. PATENT DOCUMENTS

| | | | |
|---|---|---|---|
| 4,927,736 A | | 5/1990 | Mueller et al. ............ 430/275 |
| 5,104,768 A | * | 4/1992 | Sassmannshausen et al. .......................... 430/192 |
| 5,114,826 A | * | 5/1992 | Kwong et al. .............. 430/192 |
| 5,288,588 A | * | 2/1994 | Yukawa et al. ............. 430/192 |
| 5,340,684 A | * | 8/1994 | Hayase et al. ............. 430/166 |
| 5,348,835 A | * | 9/1994 | Oba et al. ................. 430/192 |
| 5,518,864 A | * | 5/1996 | Oba et al. ................. 430/325 |
| 5,585,217 A | * | 12/1996 | Oba ......................... 430/191 |
| 5,753,407 A | * | 5/1998 | Oba ......................... 430/191 |
| 5,858,584 A | * | 1/1999 | Okabe et al. ............... 430/18 |

FOREIGN PATENT DOCUMENTS

| | | |
|---|---|---|
| EP | 0 424 940 | 5/1991 |
| EP | 0 863 436 | 9/1998 |
| JP | 54-116216 | 9/1979 |
| JP | 54-116217 | 9/1979 |
| JP | 54-145794 | 11/1979 |
| JP | 57-168942 | 10/1982 |
| JP | 64-60630 | 3/1989 |
| JP | 3-209478 | 9/1991 |
| JP | 4-204738 | 7/1992 |
| JP | 4-284455 | 10/1992 |
| JP | 11-84653 | 3/1999 |

OTHER PUBLICATIONS

Patent Abstracts of Japan, JP 4–284455, Oct. 9, 1992.
Patent Abstracts of Japan, JP 4–204738, Jul. 27, 1922.

* cited by examiner

Primary Examiner—John S. Chu
(74) Attorney, Agent, or Firm—Oblon, Spivak, McClelland, Maier & Neustadt, P.C.

(57) ABSTRACT

A positive type photosensitive resin composition which can be developed by an aqueous alkaline solution and which is excellent in the developability and the adhesion to a substrate, is presented. Namely, the present invention presents a positive type photosensitive polyimide resin composition characterized by comprising 100 parts by weight of a solvent-soluble polyimide having repeating units represented by the formula (1) and from 1 to 50 parts by weight of a polyimide precursor having repeating units represented by the formula (2), and by further containing an o-quinonediazide compound in an amount of from 1 to 100 parts by weight per 100 parts by weight of the total amount of the repeating units represented by the formula (1) and the repeating units represented by the formula (2):

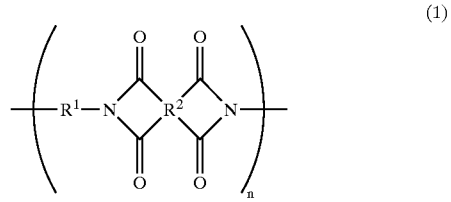

(1)

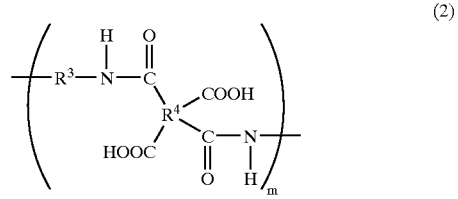

(2)

(wherein $R^1$ and $R^3$ are bivalent organic groups, from 1 to 90 mol % of $R^1$ is a bivalent organic group having one or plural groups of at least one type selected from the group consisting of a phenolic hydroxyl group, a carboxyl group, a thiophenol group and a sulfonic group, and from 10 to 99 mol % is a bivalent organic group having no phenolic hydroxyl, carboxylic, thiophenol or sulfonic group, and $R^2$ and $R^4$ are tetravalent organic groups constituting a tetracarboxylic acid or its derivative).

7 Claims, No Drawings

POSITIVE TYPE PHOTOSENSITIVE POLYIMIDE RESIN COMPOSITION

TECHNICAL FIELD

The present invention relates to a photosensitive material useful for electric/electronic devices, particular for semiconductor devices. More particularly, it relates to a positive type photosensitive polyimide resin composition excellent in the adhesion to a substrate, the developability, etc.

BACKGROUND ART

As a method for imparting photosensitivity to a polyimide resin, there may, for example, be mentioned a method of chemically bonding a crosslinkable group to a soluble polyimide precursor as disclosed in e.g. JP-A-54-116216 and JP-A-54-116217, or a method of mixing crosslinkable monomers as disclosed in JP-A-54-145794 and JP-A-57-168942.

The above methods are of a negative type wherein an exposed portion is crosslinked and made insoluble by light, and they have a problem with respect to safety as an organic solvent is used for development, and further have a drawback that it is difficult to carry out fine processing at a high resolution, since the exposed portion will be swelled by a developing solution.

Whereas, recently, a positive type photosensitive resin material has been developed and has attracted an attention, which can be developed by an aqueous alkaline solution. For example, JP-A-64-60630 discloses a method of mixing an o-quinonediazide compound to an organic solvent-soluble polyimide resin having hydroxyl groups introduced. Further, JP-A-3-209478 discloses a method wherein a resin excellent in transparency is used as an organic solvent-soluble polyimide resin, and accordingly, by mixing an o-quinonediazide compound, a very high sensitivity and a high resolution can be attained.

However, these methods have had a problem that the adhesion to a substrate of e.g. silicon, is not adequate, and if no pretreatment of the substrate with a silane coupling agent or the like is carried out at the time of forming a pattern, the resin is likely to peel from the substrate during the development or after curing. Further, a solvent-soluble polyimide resin having the alkali affinity extremely lowered, is used in order to suppress the alkali solubility of a non-exposed portion and to make a large difference in the solubility rate from an exposed portion, when an o-quinonediazide is mixed thereto.

Thus, while they had excellent characteristics, conventional positive type photosensitive polyimide resins were not fully satisfactory from the viewpoint of a process in view of e.g. the low adhesion or low developability.

DISCLOSURE OF THE INVENTION

The present invention has been made in view of the above-mentioned situations and is intended to provide a positive type photosensitive resin composition which can be developed with an aqueous alkaline solution and which is excellent in the developability and the adhesion to a substrate.

The present inventors have conducted an extensive study to solve the above-mentioned problems and have finally arrived at the present invention.

The present invention relates to a positive type photosensitive polyimide resin composition characterized by comprising 100 parts by weight of a solvent-soluble polyimide having repeating units represented by the formula (1):

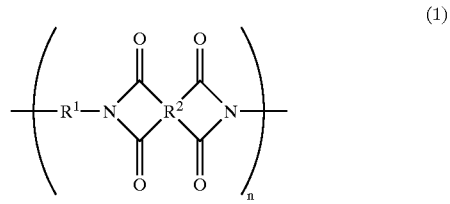

(wherein repeating units n is an integer of from 3 to 1000, $R^1$ represents a bivalent organic group constituting a diamine, $R^2$ represents a tetravalent organic group constituting a tetracarboxylic acid or its derivative, and $R^1$ is a bivalent organic group wherein from 1 to 90 mol % of the diamine component has one or plural groups of at least one type selected from the group consisting of a phenolic hydroxyl group, a carboxyl group, a thiophenol group and a sulfonic group, and from 10 to 99 mol % has no phenolic hydroxyl, carboxylic, thiophenol or sulfonic group) and from 1 to 50 parts by weight of a polyimide precursor having repeating units represented by the formula (2):

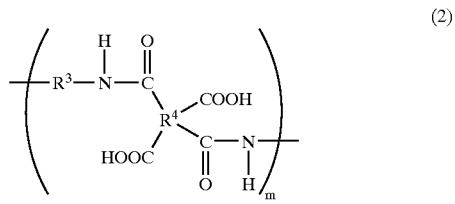

(wherein repeating units m is an integer of from 3 to 1000, $R^3$ is a bivalent organic group constituting a diamine, and $R^4$ is a tetravalent organic group constituting a tetracarboxylic acid or its derivative), and by further containing an o-quinonediazide compound in an amount of from 1 to 100 parts by weight per 100 parts by weight of the total amount of the repeating units represented by the formula (1) and the repeating units represented by the formula (2).

In one embodiment of the present invention, the bivalent organic group constituting a diamine for $R^3$ in the polyimide precursor having the repeating units represented by the formula (2), is such that from 1 to 100 mol % of the diamine component is a silicone diamine, and further, it relates to the positive type photosensitive polyimide resin composition, wherein in the solvent-soluble polyimide resin having repeating units represented by the formula (1) and in the polyimide precursor having repeating units represented by the formula (2), $R^2$ and $R^4$ are cyclobutane moieties.

Now, the present invention will be described in detail.

The diamine constituting $R^1$ in the above formula (1) of the present invention is not particularly limited so long as from 1 to 90 mol % of the diamine component is a bivalent organic group having one or plural groups of at least one type selected from the group consisting of a phenolic hydroxyl group, a carboxyl group, a thiophenol group and a sulfonic group, and from 10 to 99 mol % is a bivalent organic group having no phenolic hydroxyl, carboxylic, thiophenol or sulfonic group.

Further, the above diamine component of from 1 to 90 mol %, and the diamine component of from 10 to 99 mol % may, respectively, be single or plural. As its specific examples, the diamine having a phenolic hydroxyl group, a carboxyl group, a thiophenol group and/or a sulfonic group, may, for example, be a diamine having a phenolic hydroxyl group, such as 1,3-diamino-4-hydroxybenzene, 1,3-diamino-5-hydroxybenzene, 1,3-diamino-4,6-dihydroxybenzene, 1,3-diamino-2-hydroxybenzene, 1,4-diamino-2,5-dihydroxybenzene, bis(3-amino-4-hydroxyphenyl)ether, bis(4-amino-3-hydroxyphenyl)ether, bis(4-amino-3,5-dihydroxyphenyl)ether, bis(3-amino-4-hydroxyphenyl)methane, bis(4-amino-3-hydroxyphenyl)methane, bis(4-amino-3,5-dihydroxyphenyl)methane, bis(3-amino-4-hydroxyphenyl)sulfone, bis(4-amino-3-hydroxyphenyl)sulfone, bis(4-amino-3,5-dihydroxyphenyl)sulfone, 2,2-bis(3-amino-4-hydroxyphenyl)hexafluoropropane, 2,2-bis(4-amino-3-hydroxyphenyl)hexafluoropropane, 2,2-bis(4-amino-3,5-dihydroxyphenyl)hexafluoropropane, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxyphenoxy)benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl]sulfone, bis[4-(3-amino-4-hydroxyphenoxy)phenyl]propane, or 2,2-bis[4-(3-amino-4-hydroxyphenoxy)phenyl]hexafluoropropane; a diamine having a carboxyl group, such as 1,3-diamino-4-carboxybenzene, 1,3-diamino-5-carboxybenzene, 1,3-diamino-4,6-dicarboxybenzene, 1,4-diamino-2-carboxybenzene, 1,4-diamino-2,5-dicarboxybenzene, bis(4-amino-3-carboxyphenyl)ether, bis(4-amino-3,5-dicarboxyphenyl)ether, bis(4-amino-3-carboxyphenyl)sulfone, bis(4-amino-3,5-dicarboxyphenyl)sulfone, 4,4'-diamino-3,3'-dicarboxybiphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenoxy)benzene, 1,3-bis(4-amino-3-carboxyphenoxy)benzene, bis[4-(4-amino-3-carboxyphenoxy)phenyl]sulfone, bis[4-(4-amino-3-carboxyphenoxy)phenyl]propane, or 2,2-bis[4-(4-amino-3-carboxyphenoxy)phenyl]hexafluoropropane; a diamine having a thiophenol group, such as 1,3-diamino-4-mercaptobenzene, 1,3-diamino-5-mercaptobenzene, 1,4-diamino-2-mercaptobenzene, bis(4-amino-3-mercaptophenyl)ether, or 2,2-bis(3-amino-4-mercaptophenyl)hexafluoropropane; a diamine having a sulfonic group, such as 1,3-diaminobenzene-4-sulfonic acid, 1,3-diaminobenzene-5-sulfonic acid, 1,4-diaminobenzene-2-sulfonic acid, bis(4-aminobenzene-3-sulfonic acid)ether, 4,4'-diaminobiphenyl-3,3'-disulfonic acid, or 4,4'-diamino-3,3'-dimethylbiphenyl-6,6'-disulfonic acid; or a diamine having a plurality of such groups, such as bis(4-amino-3-carboxy-5-hydroxyphenyl)ether, bis(4-amino-3-carboxy-5-hydroxyphenyl)methane, bis(4-amino-3-carboxy-5-hydroxyphenyl)sulfone, 2,2-bis(4-amino-3-carboxy-5-hydroxyphenyl)propane, or 2,2-bis(4-amino-3-carboxy-5-hydroxyphenyl)hexafluoropropane.

The diamine having no phenolic hydroxyl, carboxyl, thiophenol or sulfonic group, may, for example, be 4,4-methylene-bis(2,6-ethylaniline), 4,4'-methylene-bis(2-isopropyl-6-methylaniline), 4,4'-methylene-bis(2,6-diisopropylaniline), bis[4-(3-aminophenoxy)phenyl]sulfone, 2,2'-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenyl ether, 4,4'-diaminodiphenylmethane, 1,4-bis(4-aminophenoxy)benzene, 1,3-bis(4-aminophenoxy)benzene, bis[4-(4-aminophenoxy)phenyl]sulfone, 2,2-bis[4-(4-aminophenoxy)phenyl]propane, or 2,2-bis[4-(4-aminophenoxy)phenyl]hexafluoropropane.

From the viewpoint of the solubility of a polyimide, 4,4'-methylene-bis(2,6-ethylaniline), 4,4'-methylene-bis(2-isopropyl-6-methylaniline), 4,4'-methylene-bis(2,6-diisopropylaniline), bis[4-(3-aminophenoxy)phenyl]sulfone, 2,2-bis[4-(3-aminophenoxy)phenyl]propane, or 2,2-bis[4-(3-aminophenoxy)phenyl]hexafluoropropane, may, for example, be preferred.

Further, the siloxane-containing diamine component which will be described hereinafter, may, for example, be:

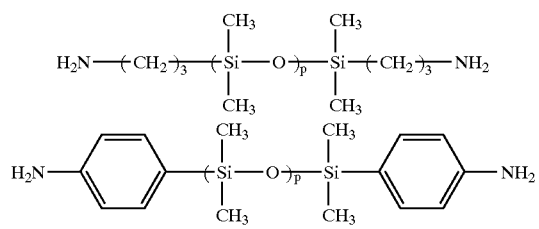

(wherein p represents an integer of from 1 to 10).

The tetracarboxylic acid or its derivative, which constitutes $R^2$ in the formula (1), is not particularly limited. However, as its specific examples, aromatic tetracarboxylic acids such as 1,2,4,5-benzenetetracarboxylic acid, 3,3',4,4'-biphenyltetracarboxylic acid, 3,3',4,4'-benzophenonetetracarboxylic acid, bis(3,4-dicarboxyphenyl)ether, 2,2-bis(3-4-dicarboxyphenyl)hexafluoropropane and bis(3,4-dicarboxyphenyl)sulfone, and their dianhydrides and their dicarboxylic diacid halides, may, for example, be mentioned. From the viewpoint of the solubility, tetracarboxylic acids such as 3,3',4,4'-biphenyltetracarboxylic acid, 3,3',4,4'-benzophenonetetracarboxylic acid, 2,2-bis(3,4-dicarboxyphenyl)hexafluoropropane and bis(3,4-dicarboxyphenyl)sulfone, and their dianhydrides and their dicarboxylic diacid halides, are preferred.

Further, alicyclic tetracarboxylic acids such as cyclobutane-1,2,3,4-tetracarboxylic acid, 3,4-dicarboxy-1,2,3,4-tetrahydro-1-naphthalenesuccinic acid, 2,3,5-tricarboxycyclopentylacetic acid, bicyclo(2,2,2-octo-7-ene-2,3,5,6-tetracarboxylic acid and tetrahydrofuran-2,3,4,5-tetracarboxylic acid, and their dianhydrides and their dicarboxylic diacid halides, may, for example, be mentioned.

Further, aliphatic tetracarboxylic acids such as butanetetracarboxylic acid, and their dianhydrides and their dicarboxylic diacid halides, may also be mentioned.

Further, to obtain a polyimide resin having high transparency in order to obtain sufficient sensitivity as a photosensitive polyimide, cyclobutane-1,2,3,4-tetracarboxylic acid, and its dianhydride and its dicarboxylic diacid halide, may, for example, be preferred among them.

A method for obtaining the solvent-soluble polyimide of the present invention, is not particularly limited. It is common to employ a method wherein a polyimide precursor is synthesized by a reaction of a tetracarboxylic dianhydride with a diamine in a polar solvent such as N-methylpyrrolidone or dimethylacetamide, followed by dehydration ring-closure.

The temperature for the reaction of the tetracarboxylic dianhydride with the diamine can be optionally selected within a range of from −20° C. to 150° C., preferably from −5° C. to 100° C.

Further, in order to convert the polyimide precursor to a polyimide, the polyimide precursor may be heated in the state of a solution at a temperature of from 150° C. to 250° C., and to remove water formed by the dehydration ring closure, toluene or xylene may, for example, be added, and azeotropic dehydration may be carried out.

Further, catalytic imidation may be mentioned as a simpler method for converting the polyimide precursor to a polyimide.

In this case, acetic anhydride and a tertiary amine such as triethylamine, pyridine, isoquinoline or imidazole, may be added to a polyimide precursor solution, and imidation can be carried out at an optional temperature of from 0° C. to 250° C.

Further, the diamine which constitutes $R^3$ in the above formula (2) of the present invention is not particularly limited, but it is preferred to employ one wherein from 1 to 100 mol % of the diamine component constituting $R^3$ is silicone diamine, whereby the adhesion to a substrate can be improved, and it is particularly preferred that from 5 to 100 mol % is a silicone diamine.

Further, such silicone diamine may be single or plural. As its specific examples, the silicone-containing diamine component may, for example, be:

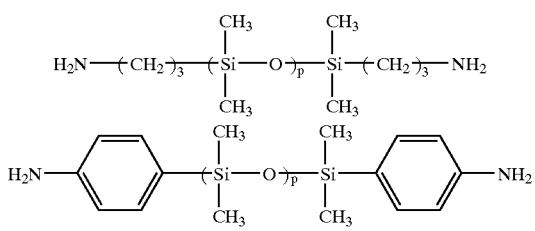

(wherein p represents an integer of from 1 to 10). Further, these diamines may be used alone or in combination as a mixture of two or more of them.

Diamines other than silicone diamines, may, for example, be 4,4-methylene-bis(2,6-ethylaniline), 4,4'-methylene-bis (2-isopropyl-6-methylaniline), 4,4'-methylene-bis(2,6-diisopropylaniline), bis[4-(3-aminophenoxy)phenyl] sulfone, 2,2-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenylether, 4,4'-diaminodiphenylmethane, 1,4-bis(4-aminophenoxy)benzene, 1,3-bis(4-aminophenoxy) benzene, bis[4-(4-aminophenoxy)phenyl]sulfone, 2,2-bis[4-(4-aminophenoxy)phenyl]propane, and 2,2-bis[4-(4-aminophenoxy)phenyl]hexafluoropropane.

The tetracarboxylic acid or its derivative, which constitutes $R^4$ in the formula (2), is not particularly limited. However, as its specific examples, aromatic tetracarboxylic acids such as 1,2,4,5-benzenetetracarboxylic acid, 3,3',4,4'-biphenyltetracarboxylic acid, 3,3',4,4'-benzophenonetetracarboxylic acid, bis(3,4-dicarboxyphenyl)ether, 2,2-bis(3,4-dicarboxyphenyl) hexafluoropropane and bis(3,4-dicarboxyphenyl)sulfone, and their dianhydrides and their dicarboxylic diacid halides, may, for example, be mentioned.

Further, alicyclic tetracarboxylic acids such as cyclobutane-1,2,3,4-tetracarboxylic acid, 3,4-dicarboxy-1,2, 3,4-tetrahydro-1-naphthalenesuccinic acid, 2,3,5-tetracarboxycyclopentylacetic acid, bicyclo(2,2,2)octo-7-ene-2,3,5,6-tetracarboxylic acid and tetrahydrofuran-2,3,4, 5-tetracarboxylic acid, and their dianhydrides and their dicarboxylic diacid halides, may be mentioned.

Further, aliphatic tetracarboxylic acids such as butanetetracarboxylic acid, and their dianhydrides and their dicarboxylic diacid halides, may also be mentioned.

Further, to obtain a polyimide resin having high transparency in order to obtain a sufficient sensitivity as a photosensitive polyimide, cyclobutane-1,2,3,4-tetracarboxylic acid, and its dianhydride and its dicarboxylic diacid halide, may, for example, be preferred.

A method for obtaining the polyimide precursor of the present invention, is not particularly limited. Usually, it can be obtained by reacting and polymerizing a tetracarboxylic dianhydride with a diamine in a polar solvent such as N-methylpyrrolidone or dimethylacetamide.

The temperature for the reaction of the tetracarboxylic dianhydride with the diamine, may suitably be selected within a range of from –20° C. to 150° C., preferably from –5° C. to 100° C.

The blending amount of the above polyimide precursor is from 1 to 100 parts by weight per 100 parts by weight of the above organic solvent-soluble polyimide. If the blending amount is smaller than 1 part by weight, the adhesion of the resulting composition at the time of forming a pattern, tends to be inadequate, and if it exceeds 100 parts by weight, the coating film tends to undergo phase separation, whereby a whitening phenomenon is likely to result, and even if a coating film is formed, the alkali solubility of a non-exposed portion tends to be too high to obtain a good pattern shape.

Further, the o-quinonediazide compound constituting the positive type photosensitive polyimide resin composition of the present invention, may be a compound which contains an o-quinonediazide group in its molecule, and is not particularly limited. For example, an o-benzoquinonediazide compound, an o-naphthoquinonediazide compound, or an o-quinolinequinonediazide compound, may, for example, be mentioned. These compounds are those which are commonly used in so-called phenol novolak-type positive photosensitive compositions. Among them, it is common to employ an o-naphthoquinonediazide compound.

The above o-quinonediazide compound is used usually in the form of an o-quinonediazide sulfonic acid ester.

Such an o-quinonediazide sulfonic acid ester is obtained usually by a condensation reaction of an o-quinonediazide sulfonic acid chloride with a compound having phenolic hydroxyl groups.

The o-quinonediazide sulfonic acid component constituting the above o-quinonediazide sulfonic acid chloride, may, for example, be 1,2-naphtoquinone-2-diazide-4-sulfonic acid, 1,2-naphthoquinone-2-diazide-5-sulfonic acid or 1,2-naphthoquinone-2-diazide-6-sulfonic acid.

Further, the above compound having phenolic hydroxyl groups, may, for example, be 2,4-dihydroxybenzophenone, 2,3,4-trihydroxybenzophenone, 2,2',4,4'-tetrahydroxybenzophenone, 2,3,4,4'-tetrahydroxybenzophenone, 2,2-bis(4-hydroxyphenyl) propane, 2,2-bis(2,3,4-hydroxyphenyl)propane or 4,4'-dihydroxyphenylsulfone.

Usually, some or all of phenolic hydroxyl groups of such a compound are substituted by the above-mentioned o-quinonediazide sulfonic acid group to obtain a di-substituted, tri-substituted, tetra-substituted, penta-substituted or hexa-substituted product, and such substituted products are used alone or in combination as a mixture thereof.

The blending amount of the above o-quinonediazide compound is from 1 to 100 parts by weight per 100 parts by weight of the total amount of the above organic solvent-soluble polyimide and the polyimide precursor. If the blending amount is less than 1 part by weight, the sensitivity at the time of exposure of the resulting composition tends to be so low that a pattern can hardly be formed. On the other hand, if it exceeds 100 parts by weight, the mechanical properties, electrical characteristics, etc. of a film formed by the resulting composition tend to be low.

When the positive type photosensitive polyimide resin composition of the present invention is to be used for e.g. electric/electronic devices, it is used in the form of a solution as dissolved in an organic solvent. This organic solvent is not particularly limited so long as it is capable of uniformly dissolving the polyimide, the polyimide precursor and the o-quinonediazide compound. Its specific examples include, for example, N,N-dimethylformamide, N,N-dimethylacetamide, N-methylpyrrolidone, N-vinylpyrrolidone, dimethylsulfoxide, m-cresol, and γ-butyrolactone.

Further, depending upon the particular purpose, other organic solvents may be incorporated so long as they do not hinder the solubility of the composition. Specific examples of such organic solvents include ethyl cellosolve, butyl cellosolve, ethylcarbitol, butylcarbitol, ethylcarbitol acetate, butylcarbitol acetate, and ethylene glycol. A polyimide precursor solution and the o-quinonediazide compound may be dissolved in a solution wherein the organic solvent-soluble polyimide has been reacted and polymerized. Otherwise, the organic solvent-soluble polyimide resin and the polyimide precursor resin precipitated and recovered by means of a poor solvent, may be dissolved together with the above o-quinonediazide compound in the above organic solvent.

The concentration of the above positive type photosensitive polyimide resin composition in the organic solvent solution is not particularly limited so long as the polyimide and the o-quinonediazide compound are uniformly dissolved in the organic solvent. From the viewpoint of processing efficiency, a concentration within a range of from 1 to 50 wt % is common.

The positive type photosensitive polyimide resin composition of the present invention may be spin-coated on a substrate such as a silicon wafer, followed by preliminary drying at a temperature of from 80 to 130° C. to form a film. In such a case, the coating film obtained from this composition has high adhesion, whereby it is not necessary to use a substrate treated with e.g. a silane type coupling agent.

On the above film, a mask having a prescribed pattern is mounted, followed by irradiation with light and by development with an alkaline developer, whereby the exposed portion will be washed off. After the development, rinsing is carried out by means of distilled water, whereby a relief pattern having a sharp edge surface can be obtained. The irradiation light to be used here may be ultraviolet light, visible light, etc. It is preferably light having a wavelength of from 200 to 500 nm. The developer may be of any type, so long as it is an aqueous alkaline solution, and an aqueous solution of an alkali metal hydroxide such as potassium hydroxide or sodium hydroxide, an aqueous solution of quaternary ammonium hydroxide, such as tetramethylammonium hydroxide, tetraethylammonium hydroxide or chorine, or an aqueous solution of an amine such as ethanolamine, propylamine or ethylenediamine, may, for example, be mentioned.

With this composition, the solubility of the exposed portion is high, and the above development can easily be carried out at room temperature.

The substrate having a relief pattern thus obtained, may be heat-treated at a temperature of from 200° C. to 400° C., whereby a polyimide coating film which is excellent in heat resistance, chemical resistance and electrical characteristics and which has a good relief pattern, can be obtained.

The composition of the present invention has positive type photosensitive characteristics of high sensitivity and high resolution and yet is easy for etching with an aqueous alkaline solution, whereby by exposure by means of a mask having a prescribed pattern, a polyimide resin coating film having a relief pattern with fine shapes and high dimensional precision, can easily be obtained.

Further, with the composition of the present invention, a relief pattern can be formed without pretreatment of a substrate with e.g. a silane type coupling agent, and the development speed can be improved as compared with a mixed composition comprising only the solvent-soluble polyimide and the o-quinonediazide compound, whereby a substantial improvement in efficiency of the pattern-forming process, can be attained.

The positive type photosensitive polyimide resin composition of the present invention can be used for e.g. an interlayer insulation film, a passivation layer film or a buffer coating layer film for semiconductor devices, or for an insulation layer film for a multilayer circuit board.

BEST MODE FOR CARRYING OUT THE INVENTION

Now, the present invention will be described in further detail with reference to Examples. However, the present invention is by no means restricted thereto. Evaluation results of the Examples and Comparative Examples are shown in Tables 1 and 2.

EXAMPLE 1

Preparation of an Organic Solvent-soluble Polyimide 4.56 g of 1,3-diamino-5-carboxybenzene (hereinafter referred to simply as DABA), 30.27 g of bis[4-(3-aminophenoxy)phenyl]sulfone (hereinafter referred to simply as BAPS) and 19.22 g of cyclobutanetetracarboxylic dianhydride (hereinafter referred to simply as CBDA) were reacted for 6 hours at room temperature in 305.81 g of N-methylpyrrolidone (hereinafter referred to simply as NMP).

After dilution with NMP to a solid content of 6.0 wt %, acetic anhydride and pyridine were added, and a dehydration ring closure reaction was carried out at 40° C. for 3 hours. This solution was put into methanol, followed by filtration and drying to obtain a polyimide powder. The number average molecular weight of the obtained polyimide was 39000 (n=70 as calculated as repeating units). Here, the number average molecular weight was measured by GPC system SSC-7200, manufactured by Senshu Kagaku Corporation. At that time, as a standard substance, polyethylene glycol was employed. The number average molecular weights disclosed hereinafter, were measured in the same manner.

Preparation of a Polyimide Precursor 10.81 g of BAPS and 4.76 g of CBDA were reacted for 6 hours at room temperature in 88.22 g of NMP to obtain an NMP solution of a polyimide precursor. The number average molecular weight of the obtained polyimide precursor was 35000 (m=55 as calculated as repeating units).

Evaluation of Photosensitive Characteristics 20 g of a 20% NMP solution of the solvent-soluble polyimide resin and 2.67 g of a 15% NMP solution of the polyimide precursor were mixed to obtain a mixed solution wherein the ratio of the solvent-soluble polyimide to the polyimide precursor was 10:1. To this mixed solution, 1.32 g of a naphthoquinone type positive photosensitizer (a compound of 2,3,4,4'-tetrahydroxybenzophenone substituted with 3 mols of 1,2-naphthoquinone-2-diazide-5-sulfonic acid) was added, followed by stirring at room temperature for 1 hour, and then by filtration by means of a filter of 0.4 μm, to obtain a solution of a positive type photosensitive polyimide resin composition of the present invention.

This photosensitive polyimide solution was directly coated on a silicon wafer by means of a spin coating and heated at 120° C. for 3 minutes on a hot plate to obtain a coating film having a thickness of about 2 μm. To this coating film, ultraviolet light was irradiated for 1 minute through a test mask (relief printing plate test chart: a mask having a number of patterns with line widths of from 1 to 50 μm arranged) by an ultraviolet irradiation apparatus PLA-501, manufactured by Canon Corporation. The ultraviolet light irradiation intensity at the exposed surface was 5 mW/cm² at a wavelength of 350 nm (as measured by an ultraviolet ray illuminometer UV-M01, manufactured by Oak Seisakusho Corporation). After the exposure, by immersion in an alkaline developer (NMD-3, manufactured by Tokyo Ohka K.K.) at about 23° C. for 140 seconds, complete elution of only the exposed portion was confirmed. The film thickness after the development and rinsing was about 2 μm. The obtained relief pattern was observed by an optical microscope, and the pattern adhesion property was evaluated by the minimum line pattern which did not undergo peeling during the development and rinsing. As a result, the pattern was found to have formed without peeling to a line width of 14 μm. As compared with a method shown in the following Comparative Examples wherein the soluble polyimide or the polyimide precursor was used alone, shortening of the development time and improvement of the pattern resolution due to the improvement in the adhesion, were confirmed.

Further, in the same manner, the photosensitive polyimide solution was coated on a silicon wafer and subjected to prebaking at 120° C. for 3 minutes, followed by heating in a circulation drying oven at 170° C. for 60 minutes and at 350° C. for 30 minutes, to obtain a cured coating film. Cross cut lines (11×11 lines) were imparted to this coating film by a cutter, followed by an adhesive tape peeling test. No peeling of the coating film was observed, and it was found that the adhesion property of the coating film after curing was also excellent.

EXAMPLE 2

An NMP solution of a polyimide precursor was obtained under the same conditions as in Example 1 except that in the preparation of a polyimide precursor in Example 1, the diamine component was changed to BAPS and bis(γ-aminopropyl)tetramethyldisiloxane (APTS), which were charged in a molar ratio of 95:5, respectively. The number average molecular weight of the obtained polyimide precursor was 27800 (m=44 as calculated as repeating units). Further, 20 g of a 20% NMP solution of the same polyimide resin as in Example 1 and 2.67 g of a 15% NMP solution of this polyimide precursor, were mixed to obtain a mixed solution of the solvent-soluble polyimide and the polyimide precursor in a ratio of 10:1. To this mixed solution, 1.32 g of a naphthoquinone type positive photosensitizer (a compound of 2,3,4,4'-tetrahydroxybenzophenone substituted by 3 mols of 1,2-naphthoquinone-2-diazide-5-sulfonic acid) was added, and in the same manner as in Example 1, a solution of a positive type photosensitive polyimide resin composition of the present invention was obtained.

This photosensitive polyimide solution was directly coated on a silicon wafer by means of a spin coater and heated at 120° C. for 3 minutes on a hot plate to obtain a coating film having a thickness of about 2 μm. To this coating film, ultraviolet light having the same irradiation intensity as in Example 1 was irradiated for 1 minute through a test mask by an ultraviolet light irradiation apparatus PLA-501, manufactured by Canon Corporation. After the exposure, by immersion for 140 seconds in an alkaline developer (NMD-3, manufactured by Tokyo Ohka K.K.) at about 23° C., elution of only the exposed portion, was confirmed. The film thickness after the development and rinsing was about 2 μm. As a result, a pattern was formed without peeling to a line width of 3 μm. Further, it was confirmed that no peeling of the pattern was observed to 3 μm even when the development time was set to be 210 seconds. As compared with a method shown in Comparative Examples wherein the soluble polyimide or the polyimide precursor was used alone, shortening of the development time and improvement in the resolution of a pattern, were confirmed.

Further, the photosensitive polyimide solution was coated on a silicon wafer in the same manner and subjected to prebaking at 120° C. for 3 minutes, followed by heating at 170° C. for 60 minutes and at 350° C. for 30 minutes by a circulation drying oven, to obtain a cured coating film. Cross cut lines (11×11 lines) were imparted to this coating film by a cutter and subjected to an adhesive tape peeling test. No peeling of the coating film was observed, and it was observed that the adhesion of the coating film after the curing, was also excellent.

COMPARATIVE EXAMPLE 1

Only the solvent-soluble polyimide component (5.0 g) prepared as in Example 1, was dissolved in NMP (29.6 g), and 1.5 g of a naphthoquinone type positive photosensitizer (a compound of 2,3,4,4'-tetrahydroxybenzophenone substituted by 3 mols of 1,2-naphthoquinone-2-diazide-5-sulfonic acid) was added. In the same manner as in Example 1, a solution of a photosensitive polyimide resin composition, was obtained.

This photosensitive polyimide solution was coated directly on a silicon wafer by means of a spin coater and heated at 120° C. for 3 minutes on a hot plate, to obtain a coating film having a thickness of about 2 μm. To this coating film, ultraviolet light having the same irradiation intensity as in Example, was irradiated for 1 minute through a test mask by an ultraviolet light irradiation apparatus PLA-501, manufactured by Canon Corporation. After the exposure, development was carried out by immersion for 150 seconds in an alkaline developer (NMD-3, manufactured by Tokyo Ohka K.K.) at about 23° C. However, during the development, peeling of all patterns was observed.

COMPARATIVE EXAMPLE 2

1.35 g of a naphthoquinone type positive photosensitizer (a compound of 2,3,4,4'-tetrahydroxybenzophenone substituted by 3 mols of 1,2-naphthoquinone-2-diazide-5-sulfonic acid) was added to 30 g of a 15% NMP solution of a polyimide precursor component prepared as in Example 2. In the same manner as in Example 1, a solution of a positive type photosensitive polyimide resin composition was obtained.

This photosensitive polyimide solution was coated directly on a silicon wafer by means of a spin coating and heated at 120° C. for 3 minutes on a hot plate to obtain a coating film having a thickness of about 2 μm. To this coating film, ultraviolet light having the same irradiation intensity as in Example 1 was irradiated for 1 minute through a test mask by an ultraviolet light irradiation apparatus PLA-501, manufactured by Canon Corporation. After the exposure, development was carried out by immersion for 150 seconds in an alkaline developer (NMD-3, manufactured by Tokyo Ohka K.K.) at about 23° C. However, during the development, a substantial decrease in the film thickness of the exposed portion was observed, and no substantial patterns remained on the silicon substrate.

COMPARATIVE EXAMPLE 3

Firstly, an aminosilane type coupling agent was coated on a silicon wafer by means of a spin coater. Further, the photosensitive polyimide solution of Comparative Example 1 was coated by means of a spin coating and heated at 120° C. for 3 minutes on a hot plate to obtain a coating film having a thickness of about 2 μm. To this coating film, ultraviolet light having the same irradiation intensity as in Example 1 was irradiated for 1 minute through a test mask by an ultraviolet light irradiation apparatus PLA-501, manufactured by Canon Corporation. After the exposure, development was carried out with an alkaline developer (NMD-3, manufactured by Tokyo Ohka K.K.) at about 23° C., whereby immersion for 200 seconds was required to have the exposed portion eluted completely. As a result, patterns were formed without peeling to a line width of 3 μm. Further, when the development time was changed to 300 seconds, patterns were formed without peeling to 10 μm.

obtained without pretreatment of a substrate and which is excellent in developability (a high development speed) was found by using as a base resin a substance obtained by mixing a solvent soluble polyimide resin solution and a polyimide precursor solution, which contain, as constituting components, diamines having acidic groups.

What is claimed is:

1. A positive type photosensitive polyimide resin composition comprising 100 parts by weight of a solvent-soluble polyimide having repeating units represented by the formula (1):

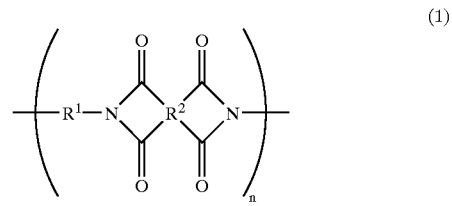

wherein n is an integer of from 3 to 1000, $R^1$ represents a bivalent organic diamine, $R^2$ represents a tetravalent organic cyclobutane tetracarboxylic acid or a derivative thereof, and wherein from 1 to 90 mol % of the diamine $R^1$ has one or plural groups of at least one selected from the group consisting of hydroxyphenol group, a carboxyl group, a thiophenol group and a sulfonic group,

TABLE 1

| | Polyimide component* | | | Polyimide precursor* | | | Development time | Pattern adhesion | |
|---|---|---|---|---|---|---|---|---|---|
| | CBDA | BAPS | DABA | CBDA | BAPS | APTS | (seconds) | Developed for X | Developed for 1.5X |
| Example | mol ratio | | | mol ratio | | | X seconds | seconds | seconds |
| 1 | 98 | 70 | 30 | 97 | 100 | — | 140 | 14 μm | — |
| 2 | 98 | 70 | 30 | 97 | 95 | 5 | 140 | 3 μm | 3 μm |

*: The ratio of the polyimide component to the polyimide precursor was 10:1 (weight ratio).
(Explanation of abbreviations)
CBDA: Cyclobutanetetracarboxylic dianhydride,
DABA: 1,3-Diamino-5-carboxybenzene,
BAPS: Bis[4-(3-aminophenoxy)phenyl]sulfone,
APTS: Bis(γ-aminopropyl)tetramethyldisiloxane

TABLE 2

| | Polyimide component | | | Polyimide precursor | | | Development time | Pattern adhesion | |
|---|---|---|---|---|---|---|---|---|---|
| | CBDA | BAPS | DABA | CBDA | BAPS | APTS | (seconds) | Developed for X | Developed for 1.5X |
| Example | mol ratio | | | mol ratio | | | X seconds | seconds | seconds |
| 1 | 98 | 70 | 30 | — | — | — | 150 | Film peeled | Film peeled |
| 2 | — | — | — | 97 | 95 | 5 | 150 | Film eluted | Film eluted |
| 3* | 98 | 70 | 30 | — | — | — | 200 | 3 μm | 10 μm |

*: A case in which a primer of the photosensitive polyimide film was pre-formed with a silane coupling agent.

INDUSTRIAL APPLICABILITY

A positive type photosensitive polyimide resin composition whereby a high pattern adhesive property can be and from 10 to 99 mol % of the diamine $R^1$ has no phenolic hydroxyl, carboxylic, thiophenol or sulfonic group, and from 1 to 50 parts by weight of a polyimide precursor having repeating units represented by the formula (2):

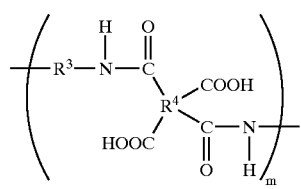 (2)

wherein m is an integer of from 3 to 1000, $R^3$ is a bivalent organic diamine, and $R^4$ is a tetravalent organic cyclobutane tetracarboxylic acid or a derivatives thereof; and an o-quinonediazide compound in an amount of from 1 to 100 parts by weight per 100 parts by weight of the total amount of the repeating units represented by the formula (1) and the repeating units represented by the formula (2).

2. The positive type photosensitive polyimide resin composition according to claim 1, wherein from 1 to 100 mol % of the diamine component $R^3$ is a silicone diamine.

3. The positive type photosensitive polyimide resin composition according to claim 1, which comprises the o-quinonediazide compound in an amount of from 5 to 50 parts by weight per 100 parts by weight of the total amount of the repeating units represented by the formula (1) and the repeating units represented by the formula (2).

4. The positive type photosensitive polyimide resin composition according to claim 2, which comprises the o-quinonediazide compound in an amount of from 5 to 50 parts by weight per 100 parts by weight of the total amount of the repeating units represented by the formula (1) and the repeating units represented by the formula (2).

5. The resin composition of claim 1, wherein the tetravalent organic tetracarboxylic acids $R^2$ and $R^4$ are selected from the group consisting of cyclobutane-1,2,3,4-tetracarboxylic acid, dianhydrides thereof and diacid dihalides thereof.

6. A film comprising the resin composition of claim 1.

7. The film of claim 6, obtained by spin coating a composition comprising the resin composition and one or more solvents onto a silicon wafer.

* * * * *